United States Patent [19]
Taylor et al.

[11] Patent Number: 5,571,393
[45] Date of Patent: Nov. 5, 1996

[54] MAGNET HOUSING FOR A SPUTTERING CATHODE

[75] Inventors: Clifford L. Taylor, Nerstrand; Daniel T. Crowley, Owatonna, both of Minn.

[73] Assignee: Viratec Thin Films, Inc., Faribault, Minn.

[21] Appl. No.: 295,324

[22] Filed: Aug. 24, 1994

[51] Int. Cl.⁶ .................................................. C23C 14/34
[52] U.S. Cl. .............................. 204/298.21; 204/192.12; 204/298.09; 204/298.22
[58] Field of Search ..................... 204/192.12, 298.21, 204/298.22, 298.09

[56] References Cited

U.S. PATENT DOCUMENTS

| | | | |
|---|---|---|---|
| 4,356,073 | 10/1982 | McKelvey | 204/192 R |
| 4,417,968 | 11/1983 | McKelvey | 204/298.22 X |
| 4,422,916 | 12/1983 | McKelvey | 204/192 R |
| 4,443,318 | 4/1984 | McKelvey | 204/298 |
| 4,445,997 | 5/1984 | McKelvey | 204/298 |
| 4,466,877 | 8/1984 | McKelvey | 204/298 |
| 4,904,362 | 2/1990 | Gaertner et al. | 204/192.12 |
| 5,096,562 | 3/1992 | Boozenny et al. | 204/298.22 |
| 5,100,527 | 3/1992 | Stevenson et al. | 204/298.22 |
| 5,200,049 | 4/1993 | Stevenson et al. | 204/298.22 |

FOREIGN PATENT DOCUMENTS 3229969  10/1981  German Dem. Rep. .

OTHER PUBLICATIONS

M. Wright et al., "Design advances and applications of the rotatable cyllindrical magnetron," *Journal of Vacuum Science and Technology A*, vol. 4, No. 3, May/Jun. 1986, pp. 388–392.

*Primary Examiner*—Nam Nguyen
*Attorney, Agent, or Firm*—Fish & Richardson P.C.

[57] ABSTRACT

A magnetron cathode having a magnet housing which encloses a magnet array and has a cooling fluid passage therethrough. The magnet housing fills a significant portion of the cathode leaving a passage of relatively low cross-section for cooling fluid flow between the magnet housing and a cathode wall. The magnet housing may be hermetically sealed to prevent magnet corrosion and may be provided with rollers which engage the cathode wall to prevent magnet housing deformation due to magnetic forces.

9 Claims, 8 Drawing Sheets

MAGNET HOUSING FOR A SPUTTERING CATHODE

BACKGROUND OF THE INVENTION

The present invention relates generally to magnetron sputtering cathodes, and more particularly to a magnet housing for a magnetron sputtering cathode.

DC reactive sputtering is a most frequently used deposition process for large area commercial coating applications, such as the application of thermal control coatings to architectural and automobile glazing. In this process, the articles to be coated are passed through a series of in-line vacuum chambers isolated from one another by vacuum locks. This system may be referred to as a continuous in-line system or a glass coater.

Inside the vacuum chambers, a sputtering gas discharge is maintained at a partial vacuum at a pressure of about 3 millitorr. The sputtering gas comprises a mixture of an inert gas, such as argon, with a small proportion of a reactive gas, such as oxygen, for the formation of oxides.

Each chamber contains one or more cathodes held at a negative potential of about −200 to −1000 volts. A layer of material to be sputtered covers the cathode surface. This surface layer is known as the target or the target material. The reactive gas forms the appropriate compound with the target material.

Ions from the sputtering gas discharge are accelerated into the target and dislodge, or sputter off, atoms of the target material. These atoms, in turn, are deposited on a substrate, such as a glass sheet, passing beneath the target. The atoms react on the substrate with the reactive gas in the sputtering gas discharge to form a thin film, It is advantageous to produce the gas discharge in the presence of a magnetic field using an apparatus known as a magnetron with an array of magnets mounted in a fixed position behind the target and the magnetic field causing electrons from the discharge to be trapped in the field and travel in a spiral pattern, thereby creating a more intense ionization and higher sputtering rates.

The rotary or rotating magnetron, developed to overcome some of the problems inherent in the so-called planar magnetron, uses a substantially cylindrical cathode and target. The target is rotated continually over a magnet array which defines a sputtering zone, such that a new portion of the target is continually presented to the sputtering zone. This has the favorable effects of easing cooling problems and allowing higher operating powers. The rotation of the target also ensures that the erosion zone comprises the entire circumference of the cathode covered by the sputtering zone. This increases target utilization. The rotating magnetron is described further in U.S. Pat. Nos. 4,356,073 and 4,422,916, the entire disclosures of which are hereby incorporated by reference.

The rotating magnetron requires bearings to permit rotation, and vacuum seals for the drive shaft, the electrical conduits and the cooling conduits. Vacuum and rotary water seals have been used to seal around the drive shaft and the conduits which extend between the coating chamber and the ambient environment. Various mounting, sealing and driving arrangements are described in U.S. Pat. Nos. 4,443,318; 4,445,997; and 4,466,877, the entire disclosures of which are also hereby incorporated by reference.. These patents describe rotating magnetrons mounted horizontally in a coating chamber and supported at both ends, each end of the cathode being attached to a spindle.

It is often preferable, however, to support the magnetron at only one end designated as the drive end by a cantilever mount. The other end of the cathode may be referred to as the free end. Several examples of cantilever mounted rotary magnetrons are given in *Design Advances and Applications of the Rotatable Magnetron,* Proceedings of the 32nd National Symposium of the American Vacuum Society, Vol. 4, No. 3, Part 1, pages 388–392 (1986), the entire text of which is hereby incorporated by reference. A cantilever mounted magnetron usually includes a bearing housing containing a drive shaft, a rotary vacuum seal, and at least two bearings spaced along the drive shaft, one of which may function as a shaft seal. Cantilever-mounted magnetron removal does not require removal of one of the mounting structures to provide the necessary clearance, and cantilever-mounted magnetrons require only one rather than two rotary seals.

A rotating magnetron incorporating a cantilever mounted removable cathode detachable from its bearing assembly is described in U.S. Pat. No. 5,100,527, assigned to the assignee of the subject application, the entire disclosure of which is hereby incorporated by reference. Such a system allows, among other things, the cathode to be removed easily and without special equipment, thus reducing system down time both by reducing the time required to replace a cathode and by making simultaneous removal of two or more cathodes more practical. A cantilever-mounted cathode having low vacuum seal loads is described in U.S. Pat. No. 5,200,049, assigned to the assignee of the subject application, the entire disclosure of which is also hereby incorporated by reference.

The cantilever-mounted cathodes are cooled by a cooling fluid such as water which is introduced and removed at the drive end of the cathode. The cathode may be hollow and enclose a concentric cooling fluid tube having an end connected, at the cathode drive end, to a cooling fluid supply tube concentric with, and inside, a cathode drive shaft. At or near the other end of the cooling fluid tube, located inside the cathode near the free end, the cooling fluid is released inside the cathode. The cooling fluid then flows on the outside of the cooling fluid tube towards the drive end as it cools the cathode, and the cooling fluid is removed through the drive shaft. The fluid flow velocity towards the drive end may be relatively low, as it occurs through a space having a relatively large cross section. As a result, the cooling effectiveness is reduced. While the fluid flow velocity could be increased in principle by increasing the fluid flow rate, the flow rate is limited by the maximum pressure that can be provided by pumps and withstood by the sputtering equipment.

The cathode magnets may be suspended from the cooling fluid tube. During operation, the magnets are subject to a magnetic force oriented in the direction of the gas discharge. This force, whose strength has not been appreciated heretofore, tends to bend the magnet assembly and the cooling fluid tube to which it is attached. Such bending may alter the magnetic field in undesirable ways and may lead to structural damage to the cathode. Another force acting upon the magnets and the cooling fluid tube is their weight.

Accordingly, an object of the present invention is to provide a magnetron cathode with high cooling fluid flow velocity without increased cooling fluid flow rate.

Another object of the present invention is to provide a magnetron cathode wherein magnet assembly deformation due to magnetic forces and weight is prevented.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the claims.

SUMMARY OF THE INVENTION

The present invention is directed to a magnetron cathode having a magnet housing which encloses a magnet array and has a cooling fluid passage therethrough. The distance between the outer surface of the magnet housing and the inner surface of the cathode wall is less than one half of the greatest inner transverse dimension of the cooling fluid passage over a majority of the inner surface of the portion of the cathode wall that is within the sputtering zone.

BRIEF DESCRIPTION OF THE DRAWINGS

The accompanying drawings, which are incorporated in and constitute a part of the specification, schematically illustrate a preferred embodiment of the invention and, together with the general description given above and the detailed description of the preferred embodiment given below, serve to explain the principles of the invention.

DESCRIPTION OF THE PREFERRED EMBODIMENT

Figure 1A:
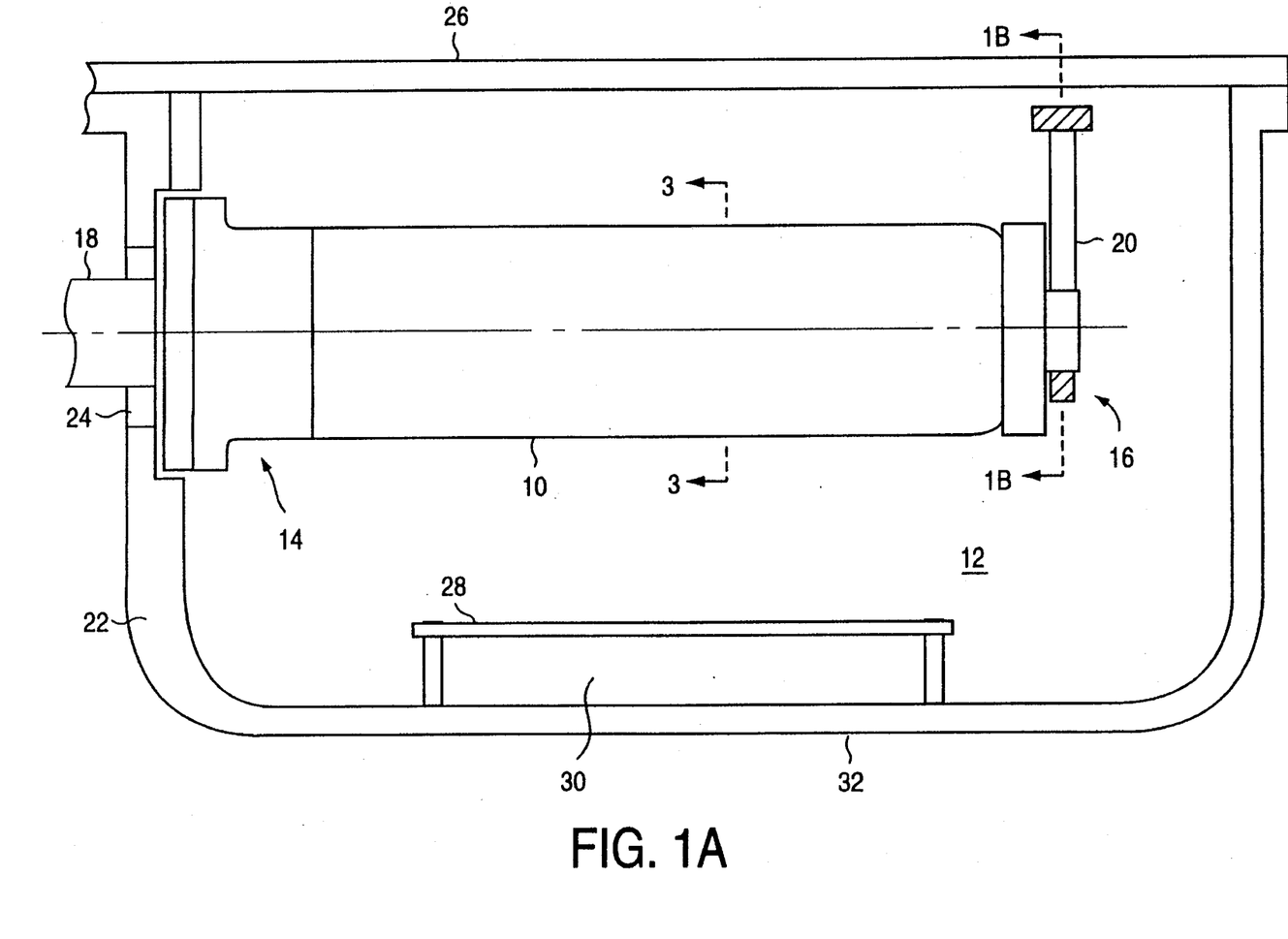
FIG. 1A is a cross-sectional, schematic view of a sputtering chamber containing a rotatable magnetron cathode, taken in a vertical direction parallel to the cathode.
Figure 1B:
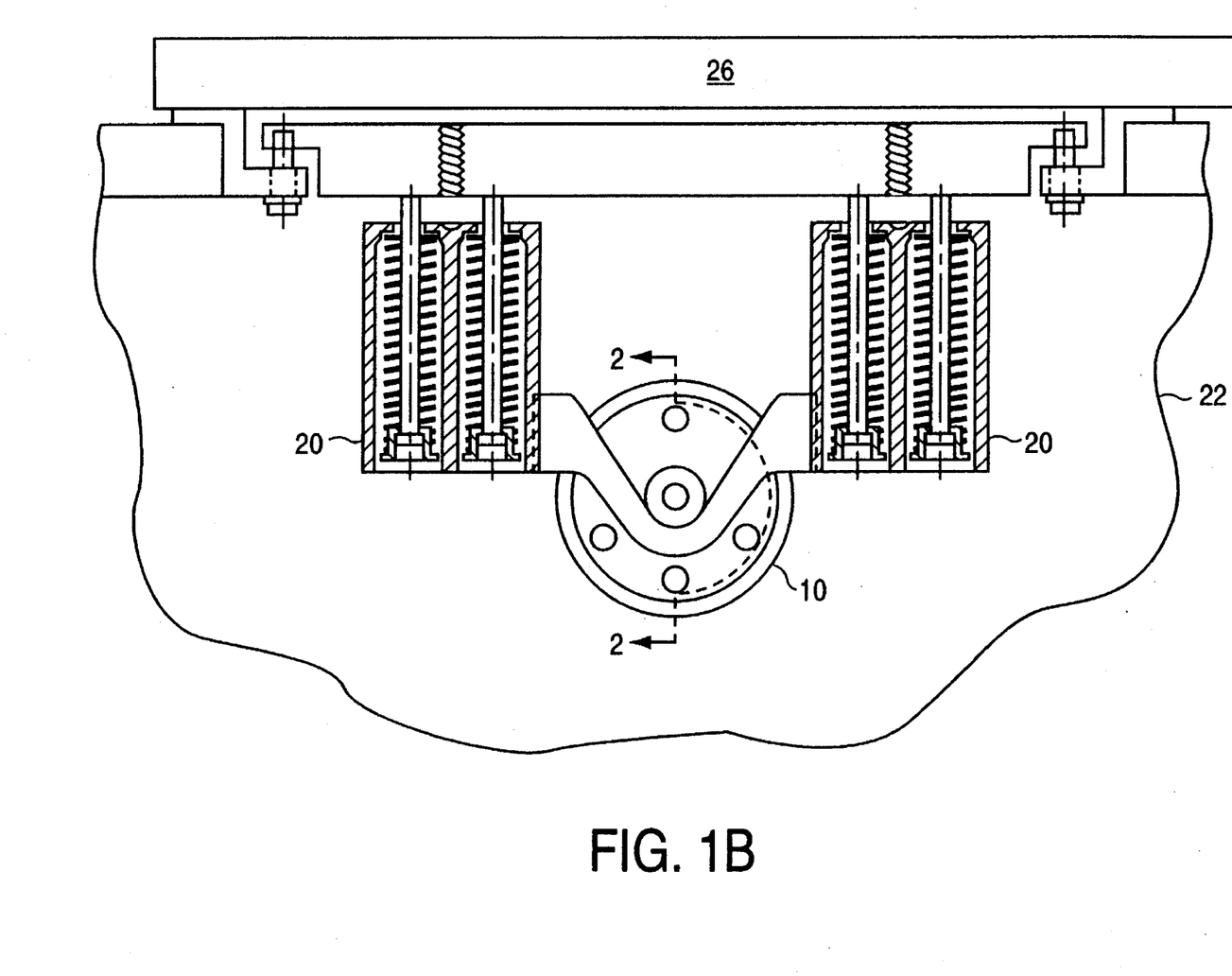
FIG. 1B is a cross-sectional view of the sputtering chamber of FIG. 1A taken along line 1B—1B of FIG. 1A.

The present invention will be described in terms of the preferred embodiment. The preferred embodiment is a rotatable magnetron cathode having a magnet housing which encloses the magnets and a cooling fluid tube. Such a structure 10 is shown in FIGS. 1A–1B.

Cathode 10 is mounted inside a sputtering chamber 12, and has a drive end 14 and a free end 16. Cathode 10 is attached at the drive end 14 to a drive shaft 18 passing through chamber wall 22 and sealed using rotary seal 24. At the free end 16, cathode 10 is suspended from chamber ceiling 26 with a spring-loaded mount 20 described in more detail in a U.S. patent application Ser. No. 08/296,295, abandoned, titled SPRING-LOADED MOUNT FOR A ROTATABLE SPUTTERING CATHODE, filed concurrently herewith, assigned to the assignee of the subject application, the entire disclosure of which is hereby incorporated by reference. Substrates 28 are carried past cathode 10 by transporter 30, such as a set of rollers, supported by chamber floor 32.

Figure 2:
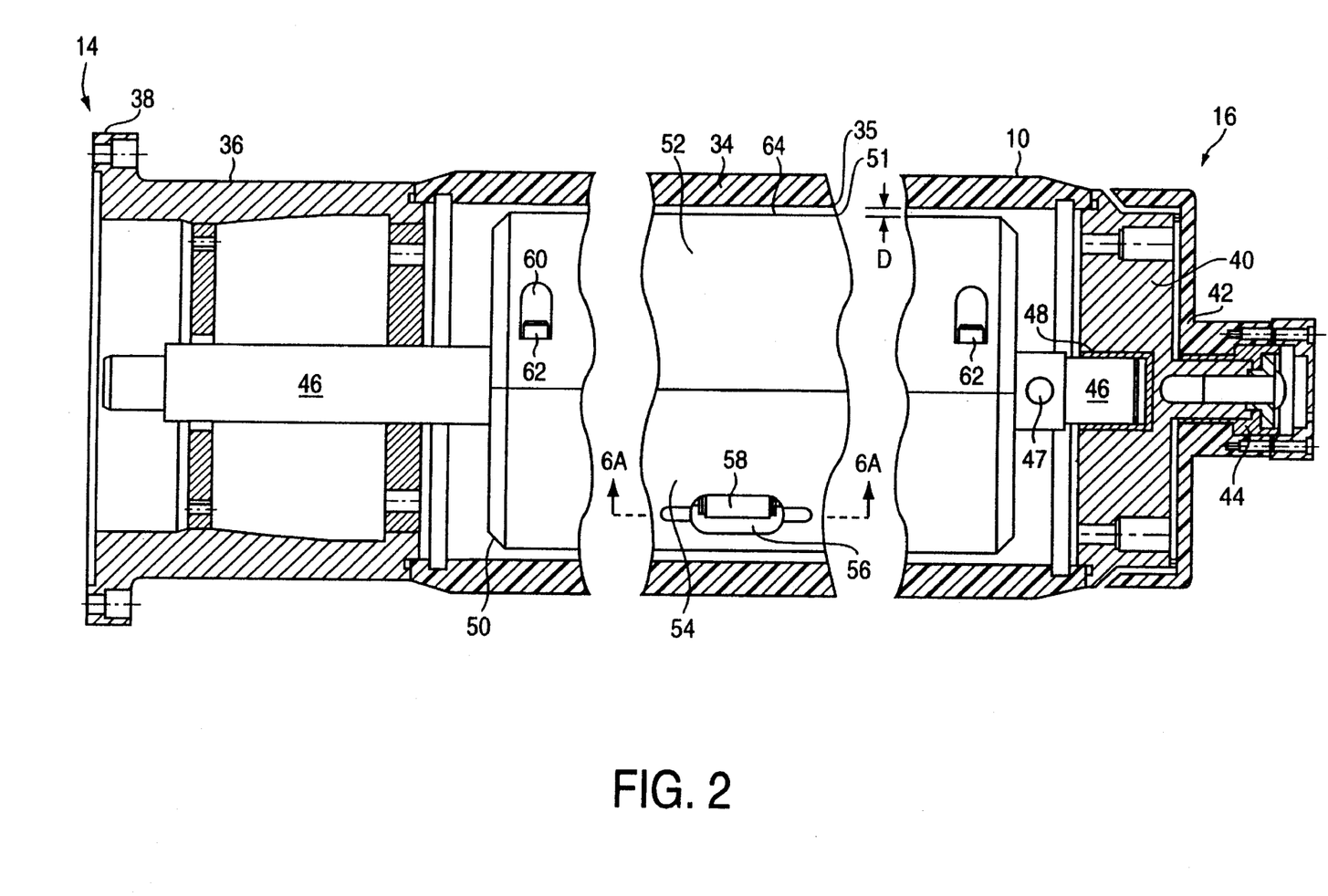
FIG. 2 is a partial cross-sectional view of the cathode of FIGS. 1A and 1B taken generally along line 2—2 of FIG. 1B.

As shown in FIG. 2, cathode 10 has a cylindrical wall portion 34 extending over the sputtering zone and formed of a target material. Alternatively, cylindrical wall portion 34 could be made of a different material and covered with a layer of target material. Cylindrical wall portion 34 is attached to a collar portion 36 made of a material such as titanium to reduce arcing and increase maximum power as described in U.S. patent application Ser. No. 07/565,921 filed Aug. 10, 1990, abandoned, assigned to the assignee of the subject application, the entire disclosure of which is hereby incorporated by reference. Collar portion 36 may also extend target life by reducing erosion at the plasma "racetrack"-turnarounds where the power density is greatest. Also, at the drive end 14, cathode 10 has a flange 38 for mounting onto drive shaft 18 (FIG. 1A).

At the free end 16, cathode 10 has an end cap 40 and a dark-space shield 42, rotatable relative to the rest of the cathode and electrically floating, attached to the cathode using insulating bearing 44. This assembly is described in above-mentioned U.S. Patent application titled SPRING-LOADED MOUNT FOR A ROTATABLE SPUTTERING CATHODE.

As discussed above and as shown in FIGS. 2 and 3A–B, inside cathode 10 and concentric therewith is cooling fluid tube 46. Cooling fluid tube 46 is held by bearing 48 at the free end such that it is rotatable relative to the rest of the cathode. Near the free end, tube 46 has an orifice or fluid passageway 47 through which the cooling fluid exits the tube.

Attached to cooling fluid tube 46 is magnet housing 50 having an Upper half 52 and a lower half 54. Magnet housing 50 is generally cylindrical and concentric with cathode 10 and cooling fluid tube 46. The distance "D" between the cylindrical sidewall 51 of magnet housing 50 and the inner surface 35 of cylindrical wall portion 34 of cathode 10 is less than the inner radius "R" (FIGS. 3A–3B) of cooling fluid tube 46, preferably less than one-half and more preferably less than one-quarter the inner radius "R" of cooling fluid tube 46. The inner radius "R" of cooling fluid tube 46 is one-half of the greatest transverse dimension "T" of the inside of the cooling fluid tube. Cylindrical cathode wall portion 34 and magnet housing 50 define a cooling fluid passage 64, which as noted has a width equal to the distance "D".

The two halves 52 and 54 of magnet housing 50 are bolted together using bolts 62. Fourteen bolts 62 may be used for a 57 inch long magnet housing. Pockets 60 are provided in the magnet housing surface 51 to accommodate the heads of bolts 62.

Magnet housing 50 is provided with roller assemblies 58 attached to its lower half 54. Roller assemblies 58 are held inside recesses 56 and extend from magnet housing 50 a distance sufficient to engage the inner surface 35 of cathode cylindrical wall portion 34. Since magnet housing 50 is attached to cooling fluid tube 46, cylindrical cathode wall portion 34 rotates relative to it. Roller assemblies 58 act as spacers during this rotation to prevent deformation of magnet housing 50 due to magnetic forces. Roller assemblies 58 may be necessary even for relatively short cathodes, due to the intensity of the magnetic forces. Such rollers may be used even in cathodes shorter than 96 inches, or even shorter than 60 inches. For instance, four pairs of roller assemblies may be used for a 57 inch long magnet housing. If the cathode diameter is sufficiently small, rollers may be necessary even for cathodes shorter than 30 inches.

A majority of the inner surface of cylindrical wall portion 34 faces the cylindrical sidewall 51 of magnet housing 50. The exceptions are the portions of cylindrical wall portion 34 at its ends (not shown), and those portions facing roller recesses 56 and pockets 60.

Figure 3A:
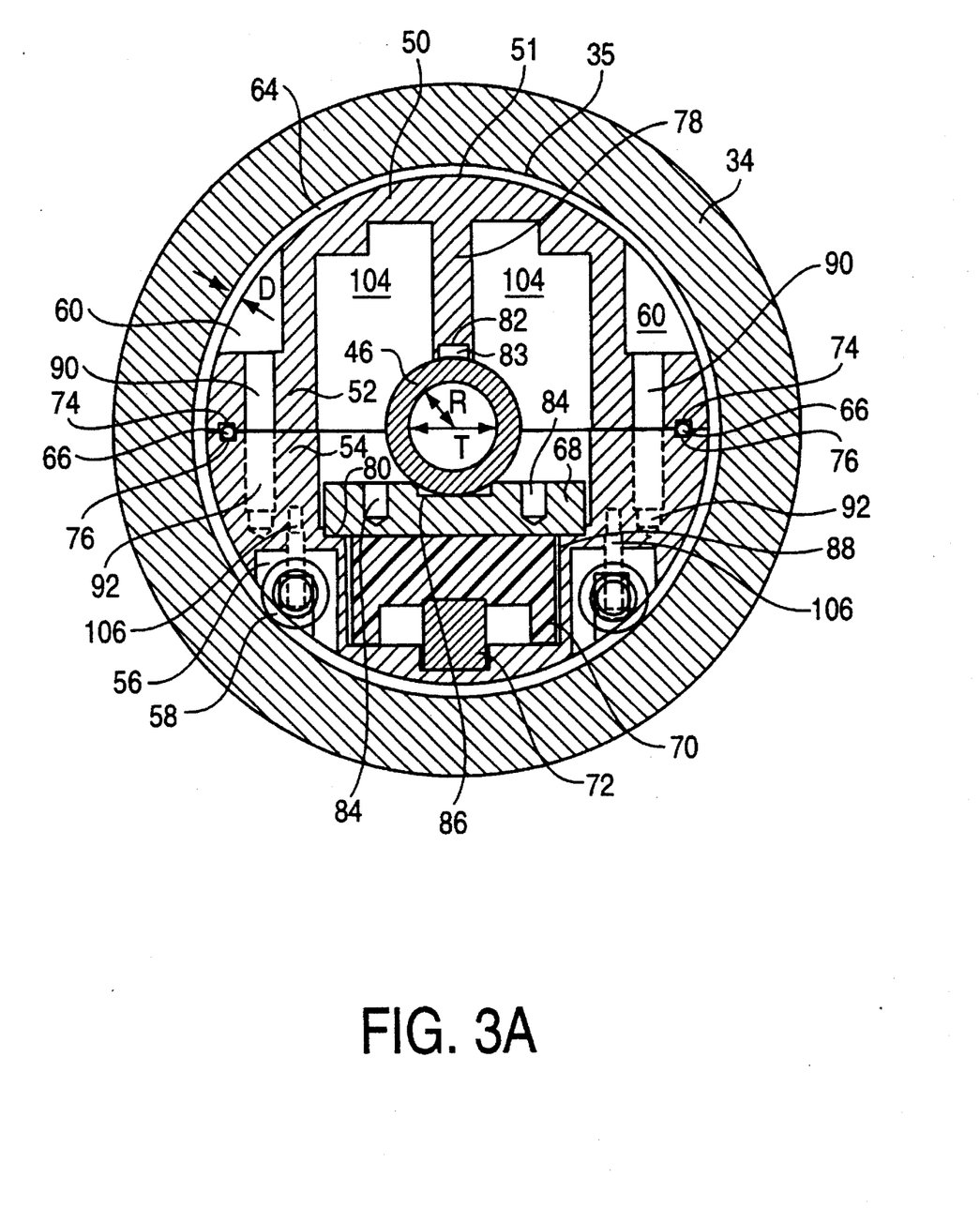
FIG. 3A is a cross-sectional view of the cathode of FIGS. 1A taken along line 3—3 of FIG. 1A.
Figure 3B:
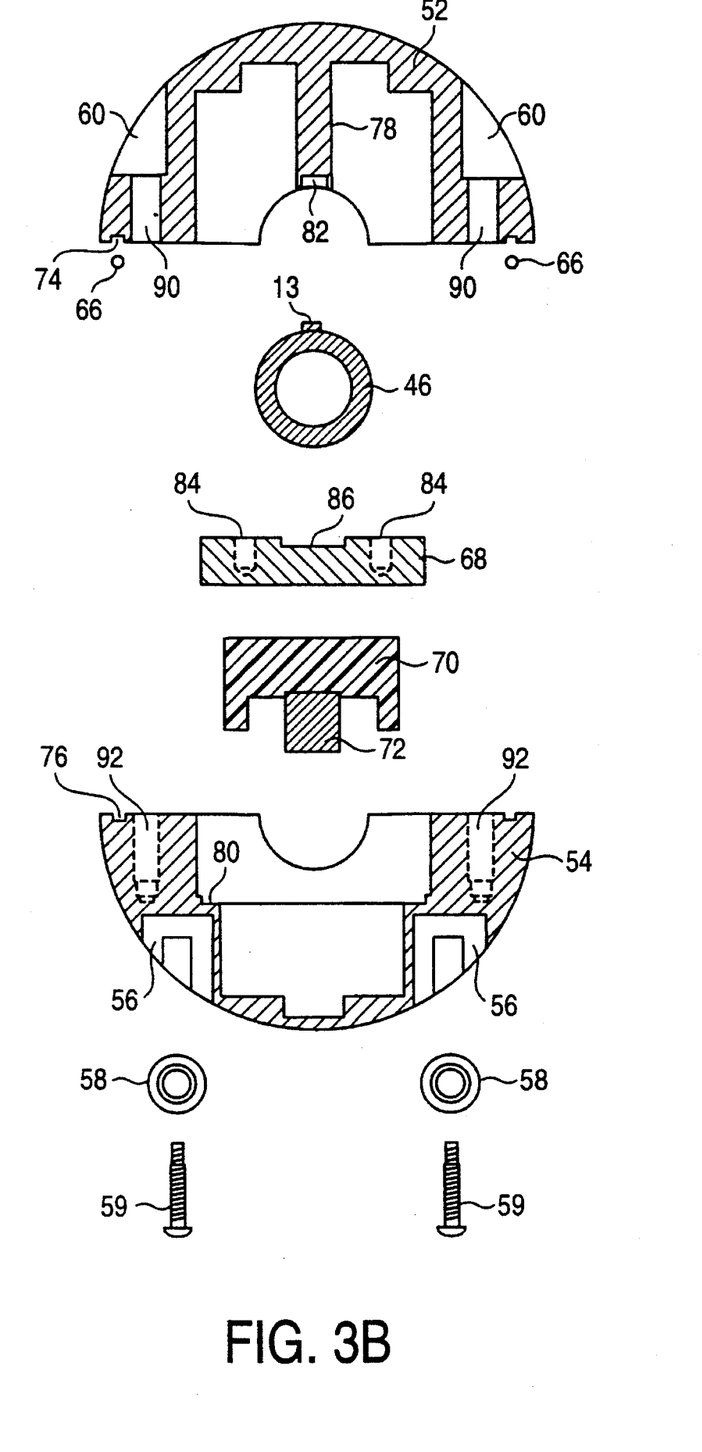
FIG. 3B is an exploded cross-sectional view of the magnet housing assembly shown in FIG. 3A.

As shown in FIGS. 3A and 3B, inside magnet housing 50 are magnets 72 (only one of which can be seen), pole piece 70 for shaping the magnetic field, magnet cavity cover 68 for confining magnets 72 and pole piece 70, alignment rods 66 for mutually aligning upper and lower magnet housing halves 52 and 54, as well as cooling fluid tube 46 described above. Alignment rods 66 are held in matching grooves 74 and 76, also shown in FIGS. 4C and 5B, of upper and lower magnet housing halves 52 and 54, respectively.

Figure 4A:
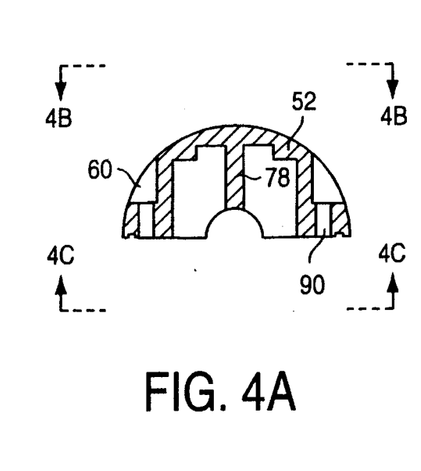
FIG. 4A is a cross-sectional view of the upper half of the magnet housing of FIG. 3A.
Figure 4B:
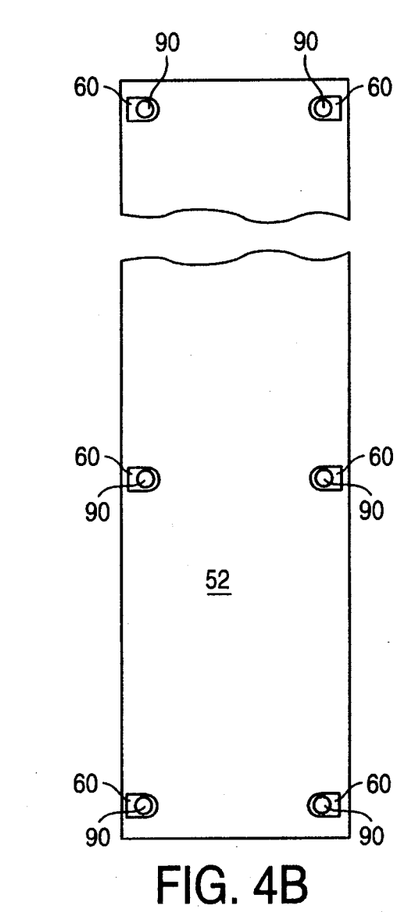
FIG. 4B is a partial top view of the upper half of the magnet housing taken along line 4B—4B of FIG. 4A.
Figure 4C:
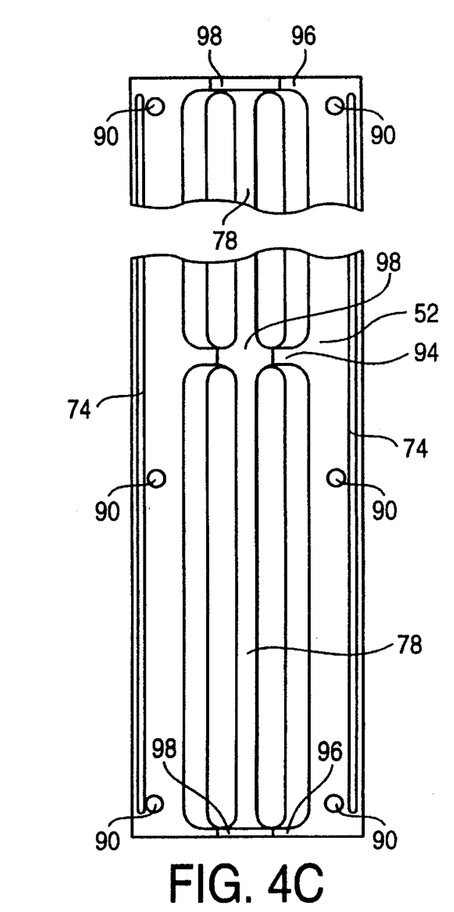
FIG. 4C is a partial bottom view of the upper half of the magnet housing taken along line 4C—4C of FIG. 4A.
Figure 5A:
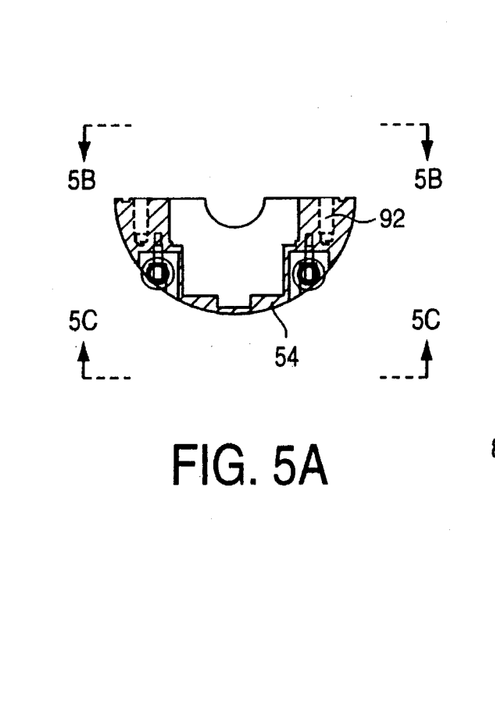
FIG. 5A is a cross-sectional view of the lower half of the magnet housing of FIG. 3A.
Figure 5B:
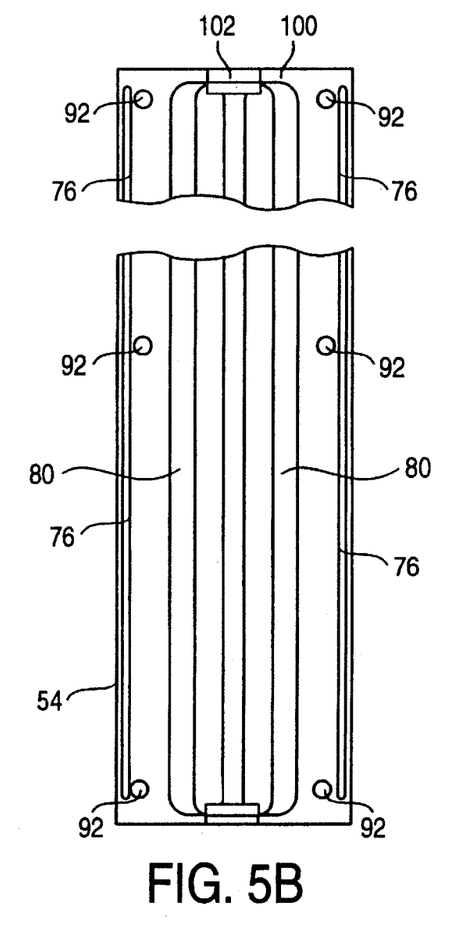
FIG. 5B is a partial top view of the lower half of the magnet housing taken along line 5B—5B of FIG. 5A.
Figure 5C:
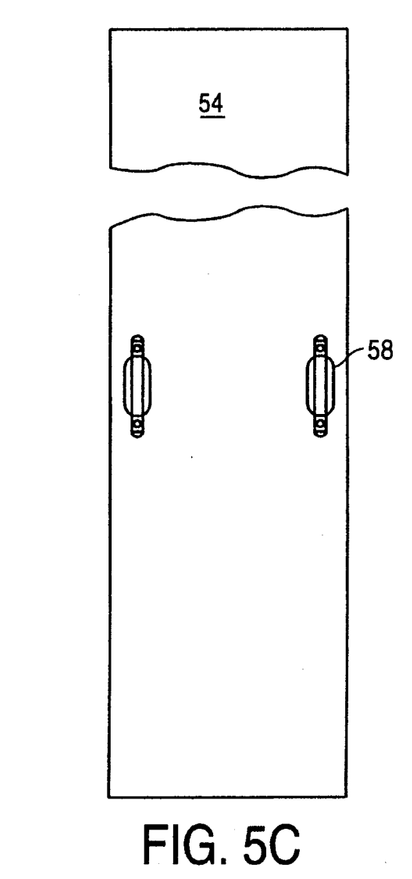
FIG. 5C is a partial bottom view of the lower half of the magnet housing taken along line 5C—5C of FIG. 5A.

Cooling fluid tube 46 and magnet cavity cover 68 are held between an inside longitudinal rib 78, also shown in FIGS. 4A and 4C, of the upper half 52 of the magnet housing, and a recessed surface 80, also shown in FIG. 5B, of the lower half 54 of the magnet housing. Longitudinal rib 78 has a pocket 82 which receives an anti-rotation pin 83 attached to cooling fluid tube 46. Magnet cavity cover 68 has threaded holes 84 to facilitate removal from lower half 54 of the magnet housing, and a groove 86 for receiving cooling fluid tube 46.

Magnet cavity cover 68 and lower half 54 of the magnet housing define a magnet cavity 88. Inside cavity 88 are held pole piece 70 and magnets 72.

The two halves of the magnet housing are bolted together by bolts 62, as shown in FIG. 2. Bolts 62 pass through orifices 90 shown in FIGS. 3A, 3B 4A, 4B and 4C, in upper half 52 of the magnet housing, and engage threaded holes 92 shown in FIGS. 3A, 3B, 5A and 5B, in lower half 54 of the magnet housing. The two halves of the magnet housing are sealed using a gasket sealant coating such that pole piece 70 and magnets 72 of the magnet array are not in contact with the cooling fluid to prevent their corrosion.

As shown in FIG. 4C, upper half 52 of the magnet housing also has transverse ribs 94 used for mechanical strength. The two ends of upper half 52 are closed by bulkheads 96. Bulkheads 96 and transverse ribs 94 have semicircular openings 98 for passage of cooling fluid tube 46.

As shown in FIG. 5B, lower half 54 of the magnet housing has its ends closed by bulkheads 100 with semicircular openings 102 for passage of cooling fluid tube 46. When the magnet housing is assembled, upper half 52, lower half 54 and magnet cavity cover 68 define a cavity 104 (FIG. 3A) which holds cooling fluid tube 46 and also reduces the weight of magnet housing 50 consistent with maintaining adequate mechanical strength.

Figure 6A:
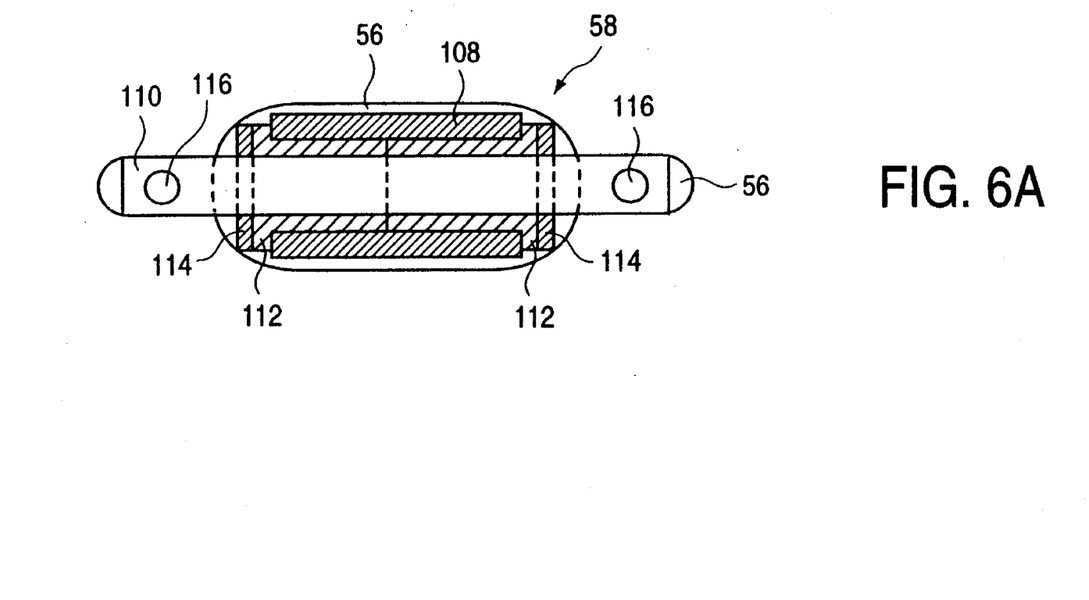
FIG. 6A is a cross-sectional view of the roller assembly of the magnet housing taken along line 6A—6A of FIG. 2.
Figure 6B:
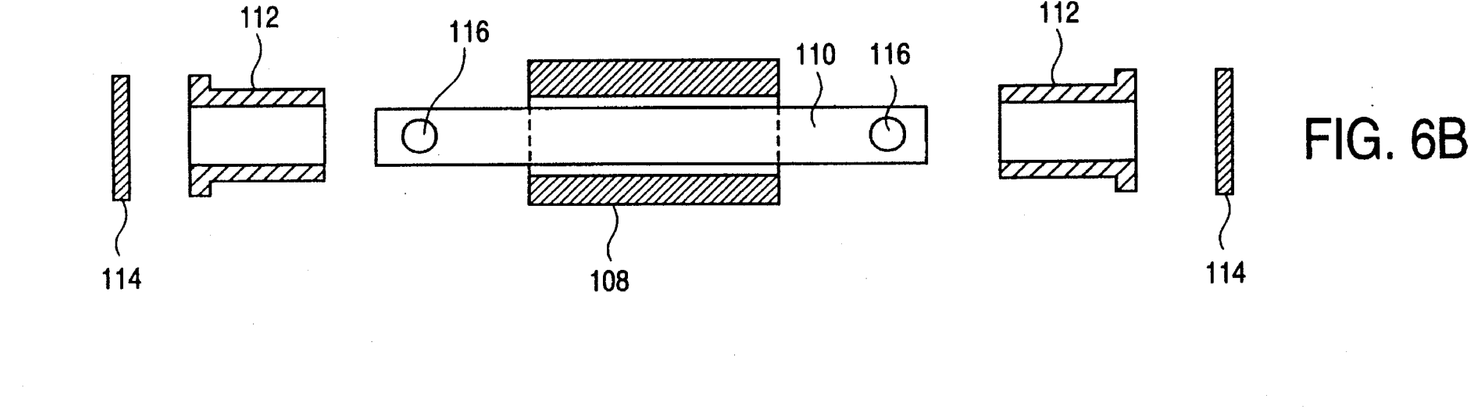
FIG. 6B is an exploded view of the roller assembly of FIG. 6A.

As shown in FIGS. 2, 3A, 3B and 5C, lower half 54 of the magnet housing has roller assemblies 58 mounted in recesses 56 using bolts 59. The roller assemblies, which as noted are spacers between magnet housing 50 and cathode wall portion 34, are shown in greater detail in FIGS. 6A and 6B. Each roller assembly comprises a stainless steel roller 108 rotatably held on a stainless steel shaft 110. Between roller 108 and shaft 110 are two bushings 112 made of ultra-high molecular weight polyethylene (UHMW) which is a low-friction material. Bushings 112 are held by two thrust washers 114. When thrust washers 114 are in place, bushings 112 prevent roller 108 from sliding along shaft 110. Shaft 110 has two orifices 116 used to bolt it inside recess 56 to threaded holes 106.

In summary, a rotatable magnetron cathode having a magnet housing which encloses the magnets and the cooling fluid tube has been described. The magnet housing fills a significant portion of the cathode leaving a passage of relatively low cross section for cooling fluid flow between the outer surface of the magnet housing and the inner surface of a cathode wall portion. This arrangement provides high coolant flow velocity without increased coolant flow. The magnet housing may have rollers to prevent its deformation due to magnetic forces, and may be hermetically sealed to prevent corrosion of the magnets and the pole piece it encloses.

The present invention has been described in terms of a preferred embodiment. The invention, however, is not limited to the embodiment depicted and described. Rather, the scope of the invention is defined by the appended claims.

What is claimed is:

1. A cylindrical magnetron cathode, comprising:

a magnet array;

a magnet housing having an upper and lower section, an outer surface and a cooling fluid passage therethrough, said lower section including a sealed magnet cavity, said magnet array disposed therein, and at least one pair of roller assemblies including a roller portion thereof disposed in recesses on either side of said magnet cavity, such that said roller portion extends beyond said outer surface of said magnet housing; and a cathode wall portion having an inner surface, said cathode wall portion being within a sputtering zone during sputtering operation, said roller portion engaging said inner surface of said cathode wall portion to prevent the deformation of said magnet housing due to magnetic forces; and wherein said magnet housing is located inside said cathode wall portion with a distance between said magnet housing outer surface and said inner surface of said cathode wall portion being less than one-half of the greatest inner transverse dimension of said cooling fluid passage.

2. The cylindrical magnetron cathode of claim 1 wherein said distance between said magnet housing outer surface and said inner surface of said cathode wall portion is less than one-quarter of the greatest inner transverse dimension of said cooling fluid passage.

3. The cylindrical magnetron cathode of claim 2 wherein said distance between said magnet housing outer surface and said inner surface of said cathode wall portion is less than one-eighth of the greatest inner transverse dimension of said cooling fluid passage.

4. The cylindrical magnetron cathode of claim 1, 2 or 3 wherein said magnet housing is rotatable relative to said cathode wall portion.

5. The cylindrical magnetron cathode of claim 1, 2 or 3 wherein said magnet housing hermetically encloses said magnet array.

6. The cylindrical magnetron cathode of claim 1, 2 or 3 wherein said cooling fluid passage is the inside of a cooling fluid tube enclosed in said magnet housing.

7. The cylindrical magnetron cathode of claim 1 wherein a length of the cathode is less than 96 inches.

8. A cylindrical sputtering apparatus, comprising: a cathode having a cathode wall portion, a magnet housing having an upper and lower section, an outer surface and a cooling fluid passage therethrough, said lower section including a sealed magnet cavity in which said magnet array is disposed, at least one pair of spacers and recesses disposed on either side of said magnet cavity, said recesses for receiving said spacers such that a portion of said pair of spacers extends beyond said outer surface of said magnet housing and engages said cathode wall portion to prevent the deformation of said magnet housing due to magnetic forces, said spacers extending a distance from said outer surface less than one-half of the greatest inner transverse dimension of said cooling fluid passage.

9. The cylindrical apparatus of claim 8 wherein said spacers are rollers.

* * * * *